(12) United States Patent
Kawase (10) Patent No.: US 7,115,507 B2
(45) Date of Patent: Oct. 3, 2006

(54) PATTERNING METHOD (75) Inventor: Takeo Kawase, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 55 days.

(21) Appl. No.: 10/623,495

(22) Filed: Jul. 22, 2003

(65) Prior Publication Data
US 2005/0176242 A1   Aug. 11, 2005

(30) Foreign Application Priority Data
Jul. 26, 2002   (GB) ................................. 0217425.8

(51) Int. Cl.
H01L 21/208 (2006.01)
B05D 3/12 (2006.01)

(52) U.S. Cl. ...................... 438/677; 438/500; 347/106; 427/98.5; 257/E21.114

(58) Field of Classification Search ................ 438/497, 438/500, 665, 677, 780; 427/98.4, 98.5; 347/16, 105; 257/E21.114, E21.115, E21.174
See application file for complete search history.

(56) References Cited

U.S. PATENT DOCUMENTS

| 3,600,061 | A | * | 8/1971 | Heilmeier et al. | .......... 349/153 |
|---|---|---|---|---|---|
| 4,668,533 | A | * | 5/1987 | Miller | ........................ 427/98.5 |
| 6,022,647 | A | * | 2/2000 | Hirose et al. | ................... 430/7 |
| 6,087,196 | A | * | 7/2000 | Sturm et al. | ................... 438/29 |
| 6,369,501 | B1 | * | 4/2002 | Aoki et al. | ................. 313/486 |
| 6,419,809 | B1 | | 7/2002 | Suzuki et al. | |
| 6,696,225 | B1 | * | 2/2004 | Kanbe et al. | ............... 430/320 |
| 6,723,394 | B1 | * | 4/2004 | Sirringhaus et al. | .......... 428/1.1 |
| 2001/0046202 | A1 | * | 11/2001 | Tanaka et al. | ........... 369/275.5 |
| 2003/0080143 | A1 | * | 5/2003 | Kale et al. | ..................... 222/1 |
| 2003/0235678 | A1 | * | 12/2003 | Graham et al. | ............. 428/156 |
| 2004/0009608 | A1 | * | 1/2004 | Caren et al. | ................ 436/174 |

FOREIGN PATENT DOCUMENTS

| EP | 0 989 778 A1 | 3/2000 |
|---|---|---|
| WO | WO 02/073712 A1 | 9/2002 |

* cited by examiner

Primary Examiner—Carl Whitehead, Jr.
Assistant Examiner—Jennifer M. Dolan
(74) Attorney, Agent, or Firm—Oliff & Berridge, PLC.

(57) ABSTRACT

A substrate is patterned by forming an indent region 8 in the surface 10 of a substrate 4 and depositing a liquid material onto the surface 10 at selected locations adjacent to the indent region 8. The liquid material spreads over the surface to an edge of the indent region, at which point further spreading is controlled by the effective enhancement of the contact angle of the liquid material relative to the surface as provided by the indent region.

27 Claims, 9 Drawing Sheets

A-A' cross-section

PATTERNING METHOD

The present invention relates to a patterning method and in particular to a patterning method for use in the fabrication of electronic, optical or optoelectronic devices, including interconnects and filters used in such devices. The present invention also relates to devices fabricated by the patterning method.

Traditionally, microelectronic and micro-optoelectronic devices have been fabricated using lithographic processes. Photolithography is an example of such a process.

Semiconducting conjugated polymer (or organic) thin-film transistors (TFTs) have more recently been proposed for use in relatively low cost logic circuits which can be fabricated on plastic substrates. These devices can also be used in optoelectronic devices and for pixel switches in high resolution active matrix displays. By appropriate selection of the conjugated polymer materials, conductor, semiconductor and insulator areas of thin film circuits can all be fabricated.

It has been proposed to form solutions of the conjugated polymers and to use an inkjet printing technique to deposit the polymer solutions at selected locations onto a host substrate. There are, however, limits to the resolution achievable with an inkjet printing technique because, unlike the more traditional use of inkjet printing, namely the deposition of printing inks onto paper, the deposited droplets tend to spread more before drying on the non-absorbent substrate and the amount to which a droplet spreads is a function of the surface energies and the interfacial energy of the solid substrate and of the liquid droplet respectively.

Moreover, the resolution required to print electronic and optoelectronic devices is far higher than that required for printing inks onto paper. Therefore, to print high resolution patterns using inkjet printing techniques, wettability pre-patterns are fabricated on the host substrate as a precursor to the actual inkjet deposition of the patterns.

Figure 1:
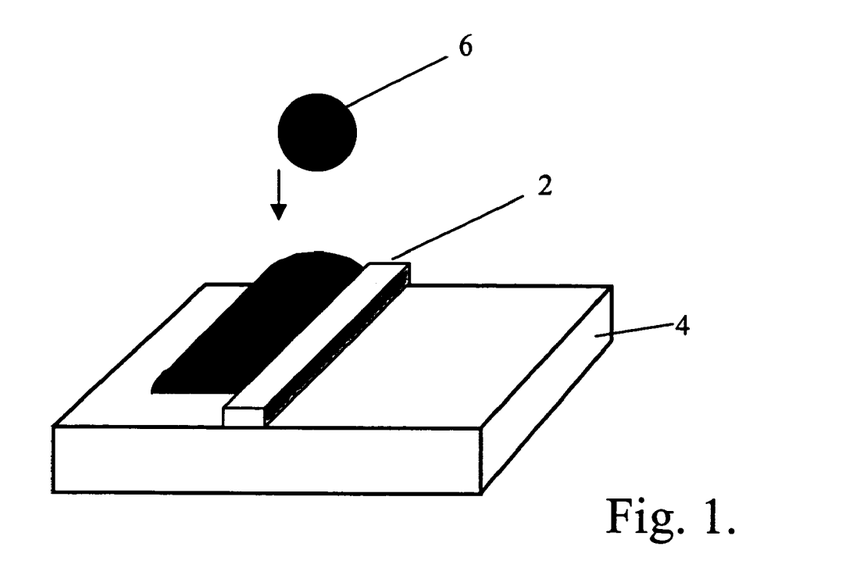
FIG. 1 shows schematically a repelling strip fabricated by a known lithographic technique.

FIG. 1 shows an example of a pre-pattern in the form of an upstanding repelling strip 2 fabricated on a substrate 4. The material which is to form the pattern is deposited as a series of droplets 6, one of which is shown in FIG. 1, onto the substrate in close proximity to the strip 2. Because the strip extends upwardly from the substrate surface it acts as a physical barrier to ensure that the flow of the material droplets across the substrate surface is controlled and therefore the material assumes the required pattern on the substrate; an elongate strip in the example shown in FIG. 1. However, the material of the strip 2 is also selected to repel the material of the droplets 6. Thus, when droplets of the material in solution are deposited alongside or in close proximity to the strip, the droplets spread over the substrate surface but are repelled by the strip 2. The solution on the substrate is therefore confined from spreading over the repelling strip, and instead aligns along the side of the strip, as shown in FIG. 1.

Such pre-patterns are however fabricated by photolithography or soft lithography. In photolithography, a spin-coated photoresist layer is provided on a substrate and is exposed by blue or ultraviolet light with an aligner or stepper, which aligns patterns on a master, comprising a photomask or reticle, with the substrate. The exposed photoresist is then developed to provide patterns of the photoresist on the substrate. This is generally followed by an etching or deposition process to pattern an objective material, which in essence provides the pre-patterns. The resolution achieved by photolithography is largely determined by the wavelength of the exposure light and the optics of the aligner or stepper. It is widely acknowledged that these processes can achieve very fine resolution but the photomask is relatively expensive to produce and the overall process requires a relatively large number of process steps.

For many industrial applications, such as displays incorporating TFT active matrix addressing schemes, there is an increasing demand for larger display areas and this necessitates the use of larger substrates. However, it has been found that such large substrates tend to exhibit bending, presenting difficulties in providing sufficiently accurate resolution and registration between the photomask and the substrate. Furthermore, if the substrate is relatively large at least parts of the photolithographic process must be performed several times and this presents further difficulties in repeating registration with sufficient accuracy over the whole area of the substrate that requires to be patterned. However, to alleviate these difficulties device manufacturers usually use a single aligner, having sufficiently high resolution and a very precise registration mechanism, not only for the formation of the patterning but also the process steps used to fabricate the actual TFTs. Such an alignment system is expensive to purchase and maintain and, moreover, processes using such an aligner are also expensive to carry out, thereby raising the manufacturing cost of the displays. Overall, the use of lithographic techniques is not satisfactory when considered in terms of overall manufacturing efficiency, accuracy or cost.

Figure 2:
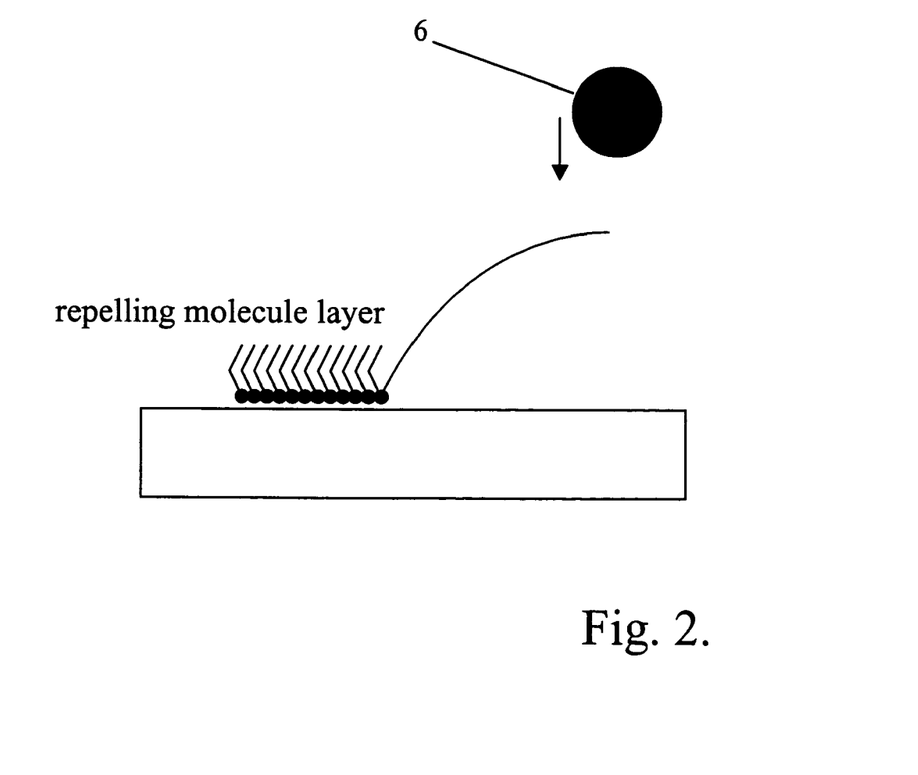
FIG. 2 shows schematically a monolayer repelling strip fabricated by a soft stamping technique.

It has also been proposed to provide the pre-patterns as a patterned repelling monolayer on the surface of the host substrate. The patterned monolayer is firstly created on a relatively soft rubber stamp, and is then transferred to the host substrate using a soft stamping technique. However, during the transfer process it is not uncommon for the stamp to distort and this distortion is recognised to become worse and more problematical as the size of the rubber stamp becomes larger. Hence, this technique is not suitable for larger sized substrates and, furthermore, because the transferred pattern is a monolayer and is extremely thin, the transferred layer cannot be checked without extreme difficulty and therefore errors or defects in the transferred patterned layer are virtually impossible to detect in a practical fabrication process. An example of such a repelling monolayer is shown schematically in FIG. 2.

Therefore, neither of the above processes provides a suitable technique for patterning in a consistent and cost effective manner.

It is an object of the present invention to provide an improved patterning method which enables the pre-patterns to be fabricated in an efficient and cost effective manner.

According to the present invention there is provided a patterning method comprising forming an indent region in the surface of a substrate and depositing a liquid material onto the surface at selected locations such that spread of the material over the surface is controlled by the indent region.

Preferably, the liquid material is deposited using an inkjet printing technique.

The indent region may be formed with wall portions substantially orthogonal to the substrate surface or sloping relative to the substrate surface.

Advantageously, the indent region may be provided with a cross-sectional profile which provides a secondary barrier to further control the spread of deposited material over the surface.

The secondary barrier may be achieved by providing the indent region with a castellated or saw-tooth cross-sectional profile.

In one embodiment the patterning method may comprise impressing first and second indent regions of elongate shape and impressing a further elongate indent region arranged between but spaced from the first and second indent regions, the further indent region having a substantially planar bottom surface.

Advantageously, the material may be selected to comprise a semiconductor material and the selected locations comprise the surface between the elongate indent regions so as to provide source and drain regions for a thin film transistor having a channel length determined by the width of the further elongate indent region.

Preferably, the semiconductor material is selected to comprise a polymer material.

In a preferred form of the patterning method for fabricating the source and drain regions for a thin film transistor, the first and second indent regions may, advantageously, be selected to have the cross-sectional profile providing the secondary barrier.

In a further embodiment of the invention, the patterning method may comprise impressing two juxtaposed elongate indent regions and wherein the material is selected to comprise a conductive material and the selected locations comprise the surface between the elongate indent regions, thereby to provide an electrically conductive electrode.

Advantageously, the wetting characteristic of the surface of the substrate relative to the material to be deposited may be adjusted.

In a preferred form of the invention the indent or indents is/are provided by impressing the surface, preferably using a stamping technique or a moulding technique.

The present invention will now be described, by way of further example only, with reference to the accompanying drawings, in which.

Figure 3A:
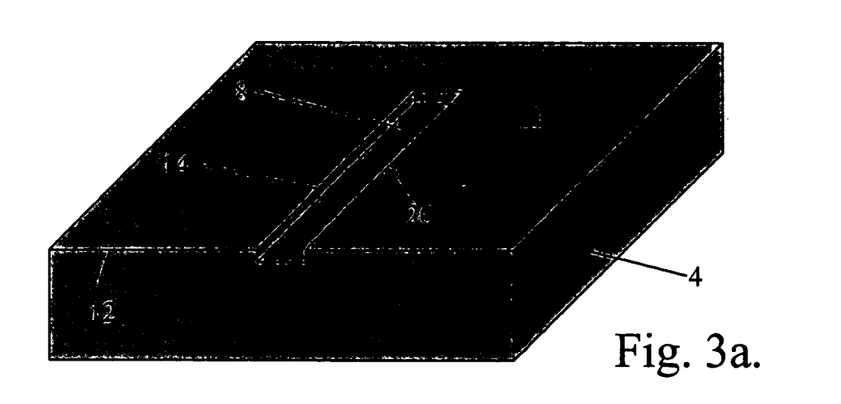
FIGS. 3a to 3c illustrate a patterning method according to the present invention.
Figure 3B:
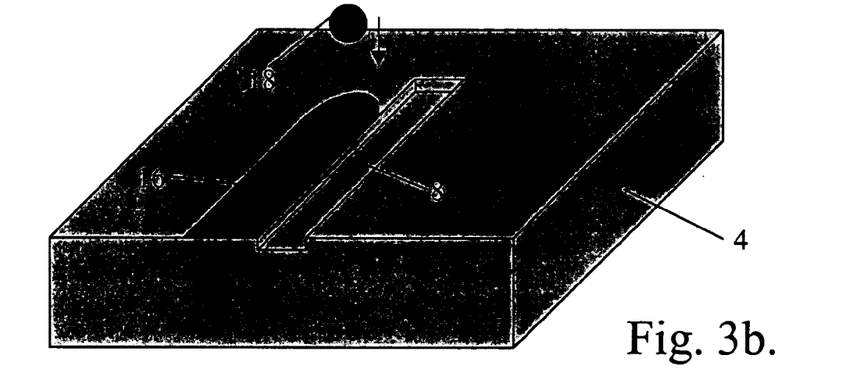
Figure 3C:
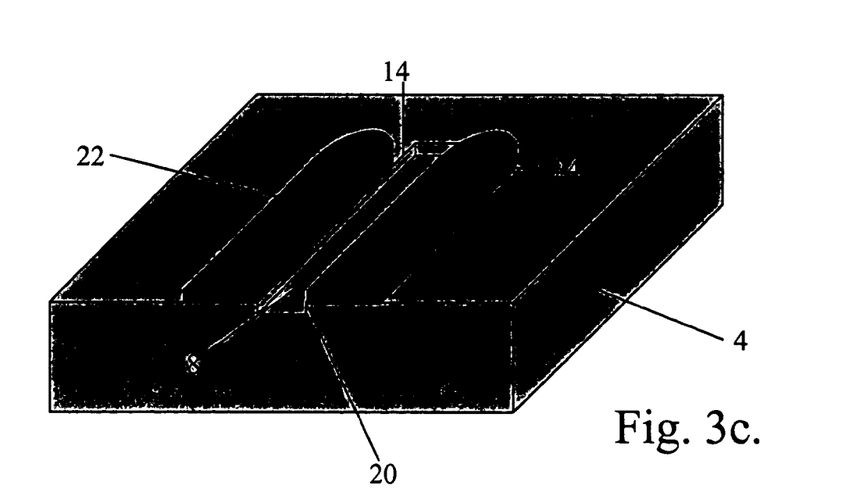

FIGS. 3a to 3c illustrate the patterning method of the present invention. An indent 8 is impressed into an upper surface 10 of the substrate 4 by any convenient technique. In FIG. 3a, the indent 8 is shown of elongate form extending to a side edge 12 of the substrate but it should be appreciated that the indent can be of any desired shape and can be provided at any position on the substrate, as long as a discontinuity is provided in the surface 10 at a boundary line 14 between the indent 8 and the surface 10.

A material 16, which is required to be formed on the surface 10 in a predefined pattern is deposited as a series of droplets 18 of the material in solution from an inkjet printhead (not shown). The material 16 is deposited onto the surface 10 at selected locations such that the material flows to the boundary line or edge 14 of the indent 8, as shown in FIG. 3b. Because the boundary line 14 is defined as a straight edge, the deposited droplets assume a straight edge profile along the boundary line but do not flow over the boundary line and into the indent 8. If the material 16 is then deposited in a similar manner onto the surface 10 at the opposite side of the indent 8, controlled spreading of the material to the right boundary line 20 of the indent 8 occurs, providing two spaced domains 22, 24 of the material with the spacing between the domains being accurately defined by the width of the indent 8.

The principle of the present invention will now be described with reference to FIGS. 4a and 4b.

When a droplet of a material in a solution is deposited onto a solid surface in a gaseous environment, three distinct interfacial energies are present: the interfacial energy between the gas and the liquid droplet; the interfacial energy between the gas and the solid surface; and the interfacial energy between the liquid and the solid surface. The size or shape of a deposited droplet on the surface is determined by the balance of these interfacial energies.

Figure 4A:
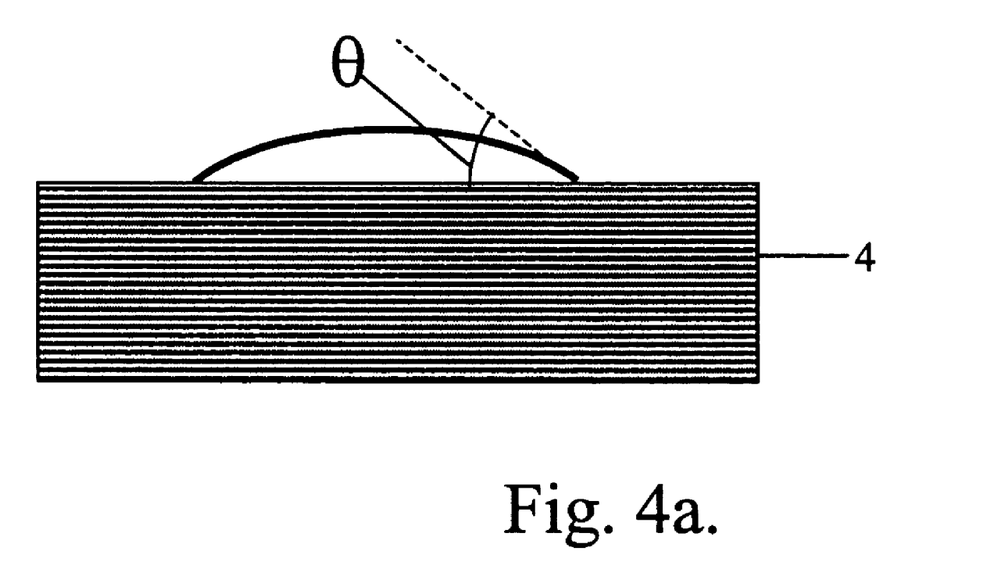
FIGS. 4a and 4b show schematically how the contact angle of a deposited droplet can vary with the profile of a host surface.

It is known that a liquid droplet on a surface exhibits a contact angle $\theta$ with that surface, as depicted in FIG. 4a. The contact angle is, in essence, dependent upon the interfacial energy between the droplet and the surface, because the interaction between liquid and solid is larger than the interactions between both liquid and solid to gas. If the contact angle is relatively small, indicating a wetting characteristic between the droplet and the surface, the contact line between the droplet and the surface tends to become large and a deposited droplet will tend to spread across the surface assuming a relatively flat domed shape as shown in FIG. 4a. Conversely, if the contact angle is relatively high, indicating a non-wetting or repelling characteristic between the droplet and the surface, the contact line tends to recede back and become smaller, because the interfacial energy is relatively large. Thus, the deposited droplet maintains a more spherical shape with less spread across the surface.

Figure 4B:
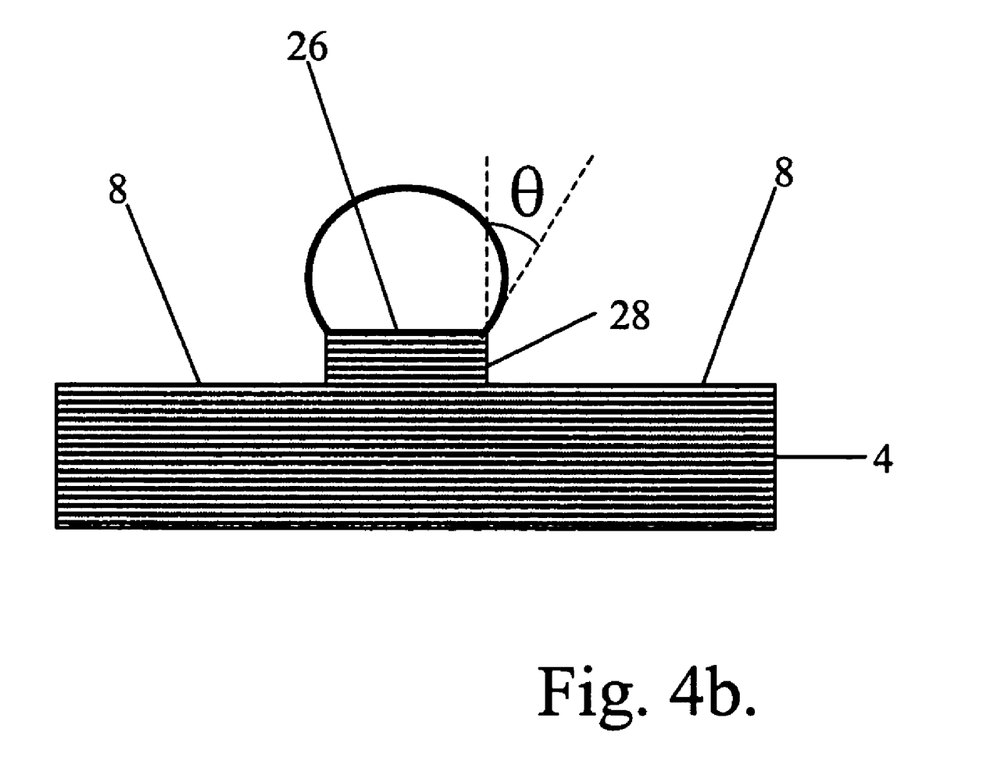

If the surface of the substrate 4 is provided with two closely spaced indents 8, as shown in FIG. 4b, and if a droplet of a material in solution having the contact angle $\theta$ is deposited onto that part of the surface 26 between the indents 8, the contact angle $\theta$ is maintained relative to the surface lying immediately outside of the contact line of the droplet to the surface. In the example shown in FIG. 4b, the surface lying immediately outside of the contact line of the droplet is a falling vertically orientated side 28 of one of the indents 8. Hence, the region 26 between the indents 8 can sustain more volume of liquid than if the same area as the region 26 were to be defined on the planar surface as shown in FIG. 4a. This means that the edges of the indents 8 confine the deposited liquid within the region 26.

When droplets are deposited by the inkjet head onto the region 26, the deposited liquid spreads up to the edge of each indent 8, and the spreading of liquid is stopped at that point unless the contact angle goes beyond and exceeds the contact angle $\theta$ in FIG. 4b. Therefore, such falling edges of the indents act as an efficient barrier for controlling the spreading of liquid. This is counterintuitive, because falling edges would be expected to enhance the spreading of liquid rather than to inhibit the spreading of liquid: the upstanding barrier structure shown in FIG. 1 would be expected to be better in controlling liquid because it has the appearance of an upstanding physical barrier. When gravity plays a dominant role in liquid spreading, this is true. However, in the diminutive environment of inkjet deposition, in which the size of a droplet is of the order of a few tens of microns, gravity does not dominate the movement of liquid but the interfacial energies (or surface tension) do. The falling edge of an indent works therefore as a very effective barrier when the effect of gravity is negligible.

When there is a contrast of wettability (or interfacial energy contrast) as in the configuration in FIG. 1, receding back of the deposited liquid can be expected. Thus, even when a droplet is deposited onto the barrier region 2 shown in FIG. 1, the droplet can move to the well region adjacent to the barrier region, which has a wetting surface. When a material providing a similar or the same wettablility is used for the indented surface, however, droplets need to be deposited onto the region between the indents. If the droplet is deposited on the edge of an indent or actually onto the region of an indent, the barrier effect provided by the indent will be lost, and that part of the liquid in the droplet deposited on the region between indents will start spreading. This is because of the uniform interfacial energy between the liquid and the surface.

If a droplet has a predefined concentration in solution of the material to be patterned, the fixed volume of material, being confined to a smaller area of the substrate, will produce when the droplet has dried a domain of the material patterned on the substrate which has a thickness greater than would be provided if the droplet of the same volume and concentration was merely allowed to spread over the planar substrate shown in FIG. 4a. This characteristic can therefore be used to create relatively narrow but relatively thick lines of patterned deposited material on the substrate. Thus, if the deposited material is selected to be a conductive polymer, such as poly-3-4-ethylenedioxythiophene (PEDOT), it is possible to fabricate narrow electrode lines with relatively high conductivity and low resistivity, and such lines are particularly suited for use in a matrix addressed display scheme.

Figure 5:
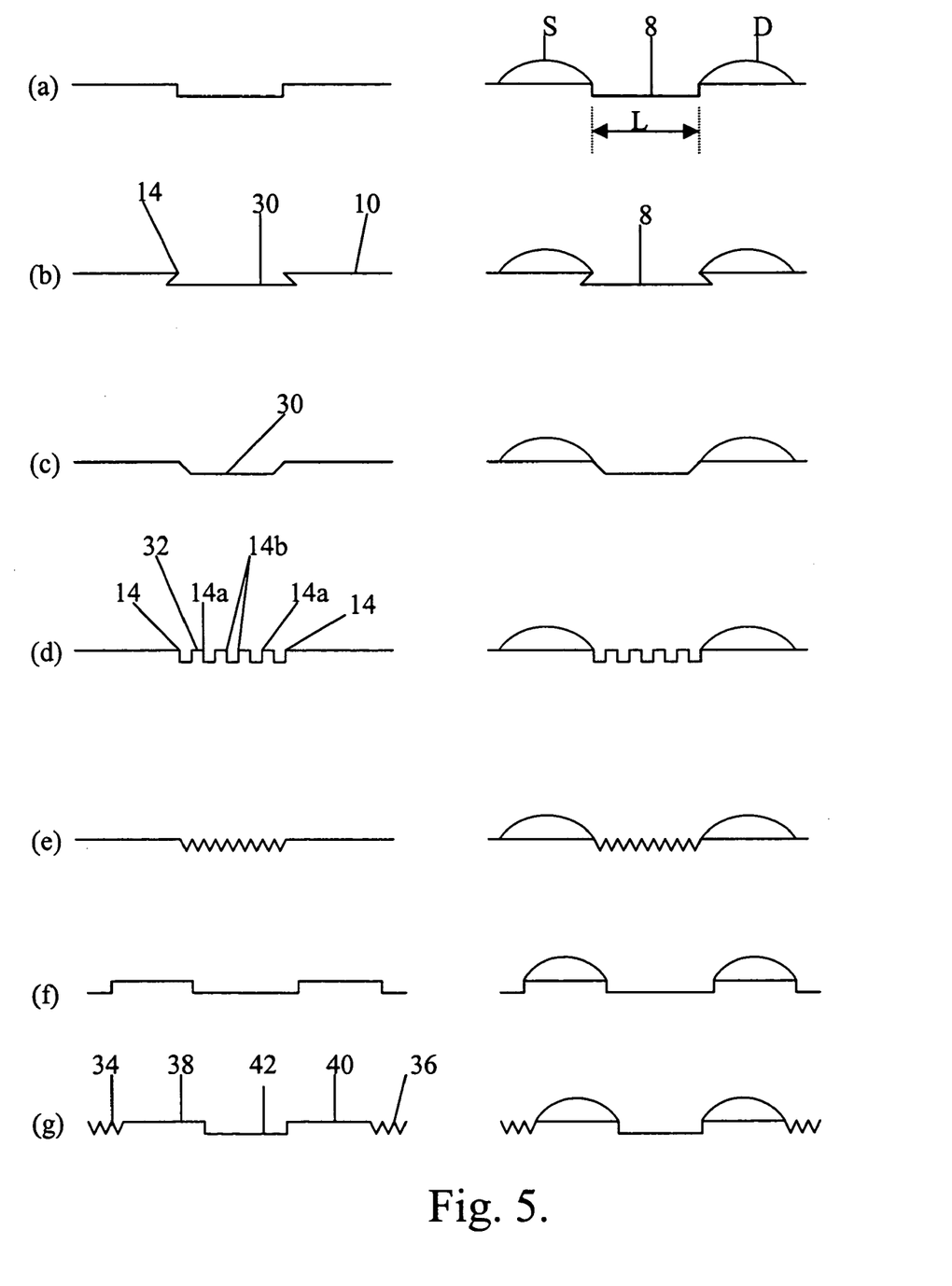
FIG. 5 shows examples of various cross-sectional profiles for the indent illustrated in FIGS. 3a to 3c.

FIG. 5 shows examples of cross-sectional profiles which may be adopted for the indents impressed into the substrate surface. It is stressed that the profiles shown in FIG. 5 are merely exemplary of the profiles which may be adopted in the method of the present invention and other profiles will be apparent to those skilled in the art.

It can be seen from the examples of FIG. 5 that many forms of profile can be adopted such as the rectangular section indent having wall portions substantially orthogonal to the surface of the substrate, as shown in example (a). Alternatively, the indent may be provided with wall portions which slope at an angle relative to the surface 10, as shown by examples (b) and (c). In this case, the wall portions may slope in a direction so as to undercut the surface 10 and provide the indent with a bottom surface 30 which is larger than the size of the indent at the surface 10, as shown by example (b). Alternatively, the wall portions may slope at acute angles relative to the surface 10 to provide a bottom surface 30 which is smaller than the size of the indent at the surface, as shown by example (c). It should be realised from the explanation given above, with reference to FIG. 4, that the "effective" contact angle for example (b) of FIG. 5 is larger than the "effective" contact angle for example (c). Thus, for a given material in solution and a given surface material for the substrate, larger droplets can be selectively deposited adjacent the indent in example (b) than is the case for example (c) without breaching the boundary line 14 between the surface and the wall portions of the indent.

Examples (d) and (e) of FIG. 5 show further examples of alternative profiles for the indent. As will be appreciated for examples (a), (b) and (c), if the boundary line 14 is breached by a deposited droplet, the deposited material will flow into the indent and because the bottom surface 30 of the indent is substantially parallel to the surface 10 of the substrate, the contact angle between the droplet and the bottom surface of the indent will be the same as the contact angle between the droplet and the surface of the substrate.

In practice, the indent is of relatively narrow width when compared to the diameter of a deposited droplet. As an example, referring to profile (a) of FIG. 5, if the deposited material is an organic conductive polymer which is deposited to either side of the indent 8 to provide a source electrode S and a drain electrode D for a TFT, the width L of the indent 8, which determines the spacing between the source and drain electrodes, defines the channel length of the TFT. Therefore, in essence, the width L of the indent defines the length of the channel region. For many practical applications, the channel region must have a length of less than 20 microns, and preferably in the region of about 5 microns. This is because the drain current of a TFT is inversely proportional to the channel length and for certain applications, such as an active matrix addressing scheme for a display, the TFT drain current is of paramount importance because that determines the speed and the aperture ratio of the display. The width L of the indent 8 may, therefore, typically be about 5 microns but the droplet will typically have a diameter of about 30 microns.

The indent 8 will typically have a depth of about 100 nm, so as mentioned above, if the boundary line 14 is breached by a deposited droplet, which may occur if there is a variation in the surface energy and the interfacial energy at a point on the substrate surface in the deposition region, in all probability the deposited droplet will spread across the entire width of the indent and extend into contact with the material patterned onto the substrate surface on the opposite side of the indent. This would give rise to a short circuit or a potential breakdown point between the source electrode S and the drain electrode D, giving a defective TFT or a TFT which would almost certainly fail prematurely in use.

The profiles shown in examples (d) and (e) of FIG. 5 are designed therefore to provide a secondary barrier to the spread of a deposited droplet beyond the boundary line 14. The indent of example (d) has a castellated cross-sectional profile and that of example (e) has a saw-tooth cross-sectional profile. In each of these examples the profiles provide, in essence, a plurality of boundary lines, shown as boundary lines 14, 14a and 14b in example (d) of FIG. 5. If the boundary line 14 is exceeded by a deposited droplet, the material would then flow across the portion 32 of the substrate surface to the boundary line 14a, which functions in the same manner as the boundary line 14. In a similar fashion, if the boundary line 14a is exceeded, the boundary line 14b acts in a similar manner to the boundary lines 14 and 14a to control further spread of the deposited material to the opposite side of the indent.

The boundary line 14 acts therefore as a primary barrier to control the spread of the droplet and the boundary lines 14a and 14b act as secondary barriers to control the spread of the droplet. Moreover, as is known to persons familiar with inkjet technology, it is not uncommon for a residue to build up around the ejection orifice of the inkjet head and this residue can cause small deflections to the flight path of a droplet ejected from the inkjet head. Thus, the direction of flight of an ejected droplet may not necessarily be orthogonal to the surface on which the ejected droplet is to be deposited. As a result, a droplet may be deposited onto the substrate at a position slightly displaced from the intended deposition location. This may cause droplets to actually deposit onto the substrate straddling the boundary line 14. With such an occurrence, the boundary lines 14a and 14b, acting to control spread of the droplet to the opposite side of the indent can prove particularly beneficial.

Example (f) of FIG. 5 shows a plurality of indents impressed into the surface of the substrate and the material can be inkjet patterned onto those parts of the substrate located between the indents. In this manner the spread of a droplet is controlled in both directions relative to the width of the indents as described in relation to FIG. 4b. As such, the finite volume of each droplet is retained within a narrower band on the surface of the substrate, resulting in a pattern of deposited material of increased thickness in comparison with the thickness of the patterned material obtained with the use of a single indent to control the spread of the droplet in only a single direction across the surface of the substrate. This can be seen in FIG. 5 by comparing the profiles of the patterned materials in examples (a) and (f).

In example (g) of FIG. 5, a control indent having a substantially planar bottom surface is provided and this is bounded on either side by indents having a cross-sectional profile providing the secondary barrier function; in this particular example the saw-tooth profile is shown but the castellated profile could also be used. The profile shown in example (g) is particularly beneficial for use in TFT fabrication. The saw-tooth profiles of the indents 34 and 36 provide the secondary barrier function and thus assist in ensuring that deposit droplets are retained on portions 38 and 40 of the substrate. However, as described above, it is important in a TFT to maintain the channel length as small as possible and this is assisted by providing centrally disposed indent 42 with a smooth bottom surface.

Figure 6A:
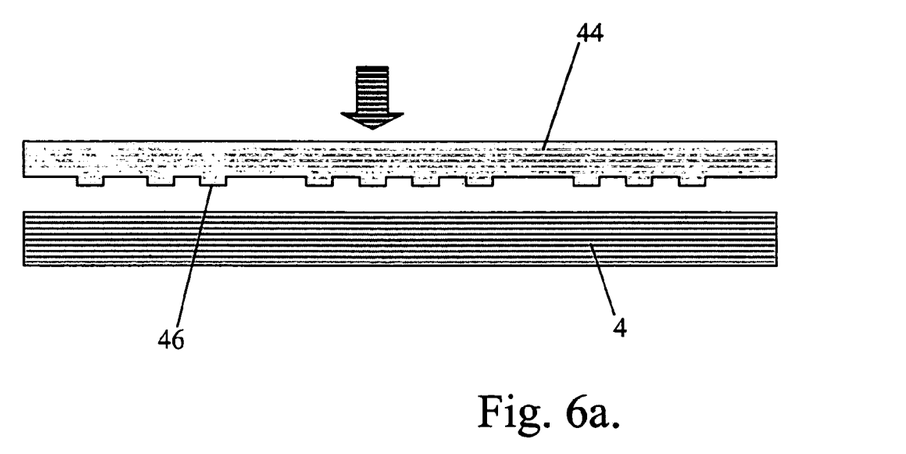
FIGS. 6a and 6b show how a surface of a substrate can be impressed in accordance with an embodiment of the invention.
Figure 6B:
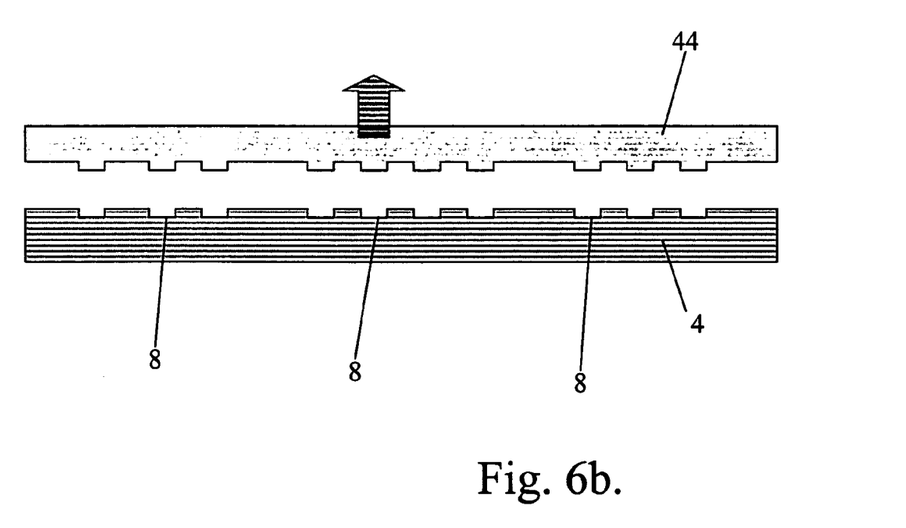

The indents may be provided extending into the substrate from the surface 10 by any suitable process. FIGS. 6a and 6b show an example of such a process in which a stamping die 44 is used to impress the indents 8 into the substrate 4. The die 44, which typically is made from metal, is provided with a pattern of projections 46 which corresponds to the required pattern for the indents 8 to be impressed in the surface of the substrate 4. The die 44 is mounted in close proximity to the substrate and then pressed into contact with the substrate to impress the pattern of indents 8 into the substrate surface. The substrate can, optionally, be heated to assist this process.

Figure 7A:
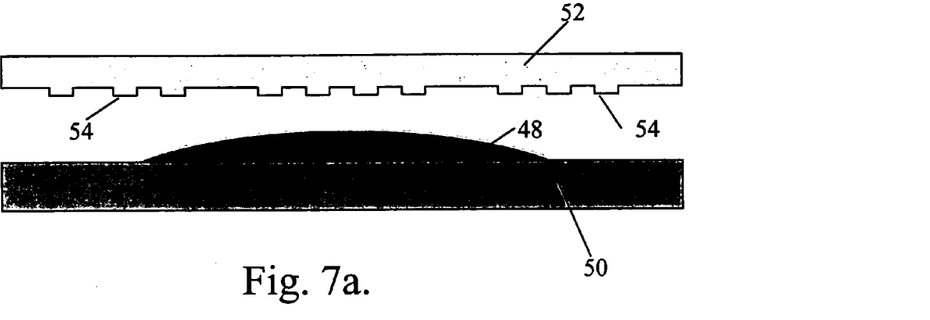
FIGS. 7a, 7b and 7c show how a surface of a substrate can be impressed in accordance with a further embodiment of the invention.
Figure 7B:
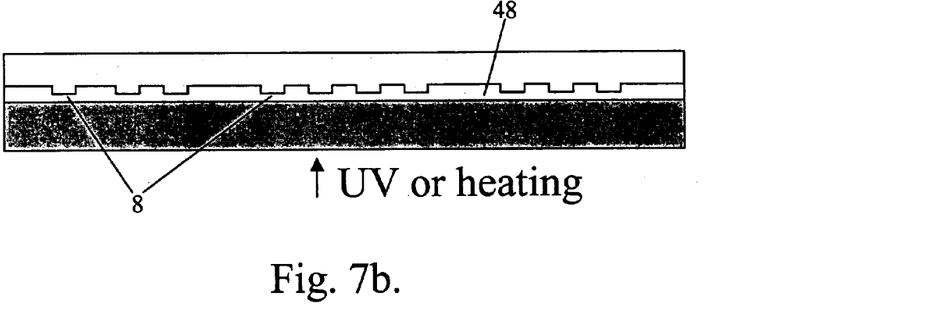

An alternative method for impressing the indents is shown in FIGS. 7a to 7c. In this embodiment a quantity of a curable material 48 is provided on a planar support 50. A plate 52, which is provided with a pattern 54 of projections corresponding to the required pattern for the indents 8 in a manner similar to the stamping die 44 shown in FIGS. 6a and 6b, is moved towards the support 50. This causes the curable material to spread over the support and into the spaces between the pattern of projections on the plate, as shown in FIG. 7b. In essence, therefore, the support 50 and plate 52 act as two opposing sides of a mould for the material 48.

Figure 7C:
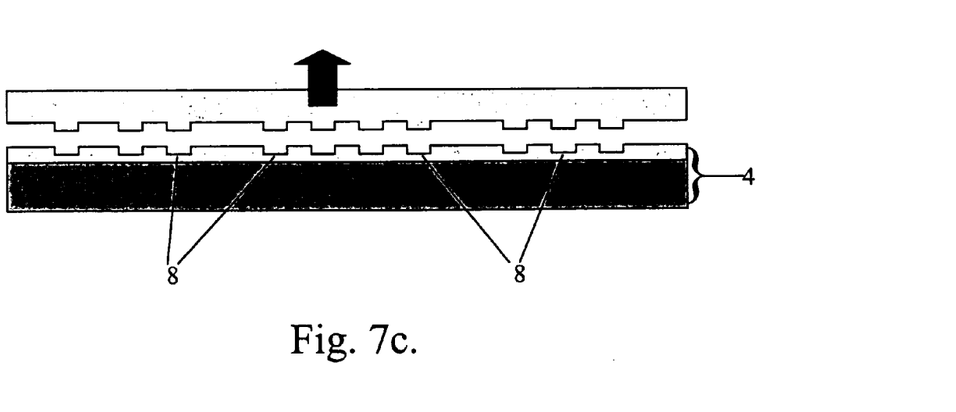

The material 48 is then cured, such as by heating or by passing ultraviolet (UV) light through the support. If the material 48 is to be cured by the use of UV light the support 50 is selected to enable transmission of the UV light through to the material 48. The plate 52 is then moved away from the support to leave a bi-layer substrate having the required pattern of indents formed in the cured material 48, as shown in FIG. 7c.

The indents preferably have a depth of about 100 nm and, with either of the above indent forming processes, the stamping die 44 or the plate 52 can be used many times to produce the required pattern of indents in the substrate surface. This is considered to be a particular advantage over the use of a lithographic technique where the relatively laborious patterning steps must be repeated each time the pattern of indents is required to be fabricated.

A depth of about 100 nm (50 nm to 300 nm) for the indents is suitable for this invention from the viewpoints both of effectiveness as a barrier and productivity by simple forming processes. In theory the barrier effect in this invention is independent of the depth of indents, but very shallow indents are not necessarily reliable. This is due to the curvature radius at the edge and defects in the edge. In order to obtain a sufficient barrier effect at the edge of the indents, the edge should be of a sharp profile; in other words, the edge should have a small curvature radius compared to the depth. If a curvature radius of less than 10 nm is achieved, indents with a depth of less than 50 nm can work effectively as a barrier. Defects could dull the edge, leading to the breach of liquid over the edge. Therefore, it is important that defects are removed, especially from the edges of the indents.

Plastic substrates with the indents may also be produced by a plastic moulding process. Melted plastics material is injected into the mould which has embossed patterns on the surface, and after cooling, a plastic substrate with indents is easily obtained.

The indents can also be manufactured by conventional photolithography techniques. Structure in developed photoresist can act as a barrier when liquid is deposited onto the remaining photoresist patterns. Furthermore, an etching process can follow the photolithography to form the indents. The etching process is particularly suitable to obtain sharp indent edges, which makes the barrier effect more reliable.

When photolithographic techniques are applied to obtain the indents, the bottom region of the indents can consist of a different material from the other regions where liquid will be deposited. For example, remaining photoresist or a thin film deposited on a substrate provides the other regions, and the original surface of the substrate provides the bottom surface of the indents. When the material of the indent bottom surface is less wetting with the deposited liquid, this structure will be more robust in terms of the barrier effect, because the barrier effect of the indent edges is reinforced by the wettability contrast between the indent bottom surface and the other regions on which the material may be deposited.

Figure 8:
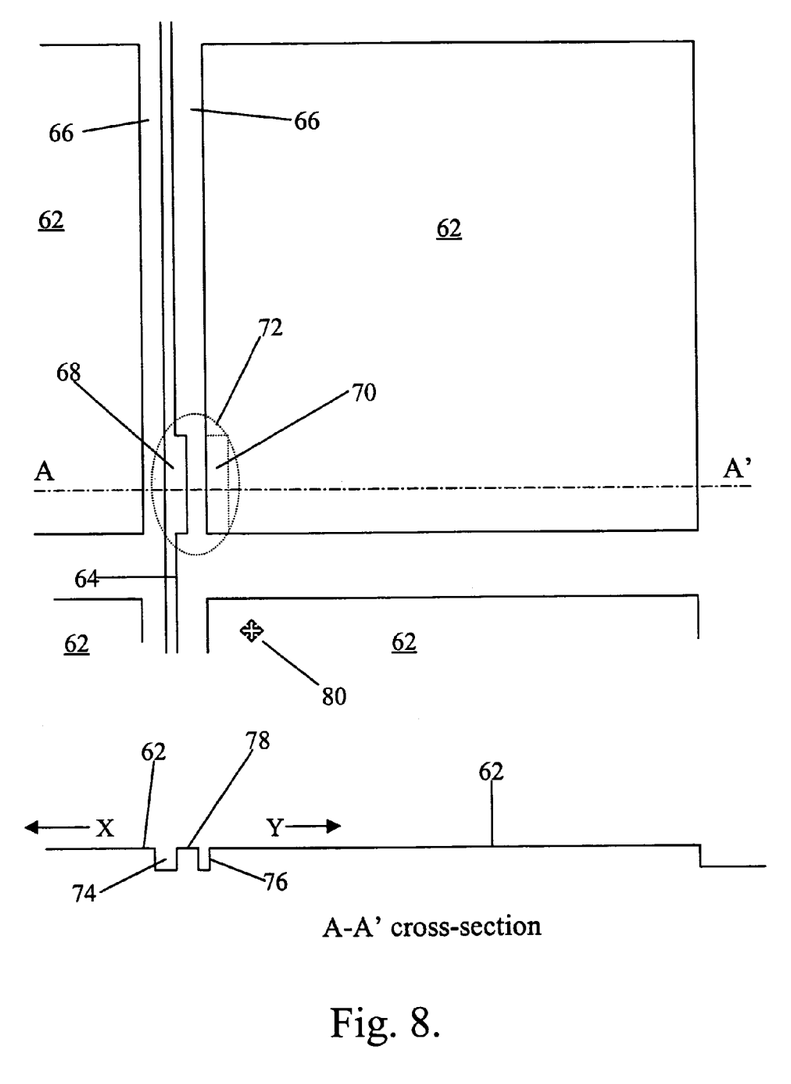
FIG. 8 shows schematically plan and cross-sectional views of an addressing scheme for an electrooptic device.

It has been mentioned above that the patterning method of the present invention can be used to fabricate relatively long and narrow lines of a conductive polymer which are particularly suited for use in a matrix addressing scheme for an electrooptic device. FIG. 8 shows an example of such a scheme.

The addressing scheme comprises a plurality of pixel electrodes 62 arranged as a matrix. Data lines 64 of a conductive material are arranged in the relatively narrow spaces 66 between the pixel electrodes. Only one data line is shown in FIG. 8 but it is to be appreciated that the addressing scheme, which typically will comprise a matrix of several hundred pixel electrodes in each row and column of the matrix, will include several hundreds of such data lines.

Each data line includes portions 68 of increased width and, in the embodiment shown, these are respectively located in close proximity to one corner of each pixel electrode 62. The portions 68 of increased width together with respective corner portions of the pixel electrodes, one of which is depicted as corner portion 70 in FIG. 8, serve as source and drain electrodes for a TFT used to drive the pixels of the display respectively located in superposition to each pixel electrode. Such a TFT is shown schematically by dotted line 72 in FIG. 8.

It is noted that the corners of the pixel electrodes 62 and portions 68 are shown as sharp corners, but equally, these may be fabricated as rounded corners. With the rounded corners, deposited liquid can fully fill the electrode region more easily than with a sharp corner.

The source and drain shown in FIG. 8 are neighbouring with a straight gap (channel) therebetween, but it is possible to provide interdigitated source and drain electrodes, each having a comb-like shape, in order to obtain a large channel width within a limited device area. In this case, liquid is deposited onto protruding regions which have a comb-like shape interdigitating each other. Thus, liquid deposited on a region adjacent to the comb teeth spreads to the comb teeth region and covers the whole of the protruding regions, thereby providing the comb-shape electrodes.

The aperture ratio of a display incorporating the addressing scheme is determined by that portion of the total display area of the display which can be used to display images to a user. The aperture ratio needs to be made as large as possible to provide a display of high contrast and brightness. Hence, the spaces 66 between the pixel electrodes 62 should be made as narrow as possible as these areas are not used to display images. But the spaces 66 need to accommodate the data lines 64. It follows therefore that the data lines should also be fabricated as very narrow and straight conductive strips and these conductive strips need to extend the full length of the display matrix.

To minimise the power requirements of the display, the data pulses which are passed by the data lines are of relatively low potential and these pulses must be transferred efficiently to the pixels of the display. When a data pulse is applied to a data line some of the potential in an applied pulse is dropped along the data line due to the inherent electrical resistance of the line. If this is not properly controlled, non-uniform brightness of the display image can occur. Therefore, the data lines need to be highly conductive but they also need to be of minimal width so as not to degrade the aperture ratio. These are contrasting requirements.

Therefore, in the embodiment of FIG. 8, the spaces 66 between the pixel electrodes 62 are provided as two impressed indents 74 and 76 with a narrow portion 78 of the substrate surface therebetween. The spacing between the indents 74 and 76 is defined so as to correspond to the required width of the data lines 64 and when a conductive material, such as PEDOT or polyanilene (PANI) in solution, or a colloidal metal suspension, is selectively deposited by an inkjet head onto the narrow portion 78, the indents 74 and 76 control the spread of the deposited solution in the lateral directions X and Y shown in FIG. 8, in a manner similar to that described with reference to example (f) of FIG. 5. Hence, the conductive material can be deposited as relatively thin and well defined lines which are relatively thick in height. Thus, the data lines can be provided with relatively high conductivity, enhancing the uniformity and brightness of the display.

Colloidal metal suspensions, which involve minute metal particles dispersed in solvent, provide especially high conductivity. When the solvent is an organic solvent, however, it is generally difficult to form narrow (or high-resolution) patterns on a planar surface with such a suspension due to the low surface tension of the solvent, which spreads easily, when compared to water-based solutions or suspensions, which have a relatively high surface tension. Even with the conventional wettability pre-patterning technique, it is difficult to obtain sufficient wettability contrast to achieve high-resolution printing, because of the interfacial energy between the surface and the solvent. However the indent structure in the present invention has been found to be particularly advantageous as a barrier with such solvent-based solutions or suspensions. The angle between the indent side wall and the plane of the adjacent surface is a dominant factor which affects the effectiveness as a barrier, and the surface tension of liquid has minimal affect. Therefore, the structure in the present invention is especially advantageous and suitable for patterning by depositing with low-surface-tension liquids.

A concern associated with inkjet patterning of electronic or optoelectronic devices is the alignment between the inkjet head and the host substrate. The flight path of deposited droplets can vary over the deposition periods required and thus there is a need to periodically check deposition alignment during the fabrication process. It has been proposed that this can be achieved through the use of deposition alignment marks strategically positioned on the substrate. Cross shaped alignment marks have been found to be particularly beneficial for this purpose, such as maltese-cross shape marks having three or more limbs. Advantageously, these alignment marks can also be provided as indents in accordance with the present invention. An example of such a mark is shown as a four limb cross 80 in FIG. 8.

Considering the interfacial energy between the surface and the solvent, it may in some cases be beneficial to provide a thin coating on the surface. For example, when using the above mentioned PEDOT as the liquid material a further improvement can be obtained by providing the surface of the substrate with a thin coating of aluminium. It is not critical when the coating is applied, either before or after the indents are formed—provided of course that it is prior to deposition of the PEDOT.

Figure 9:
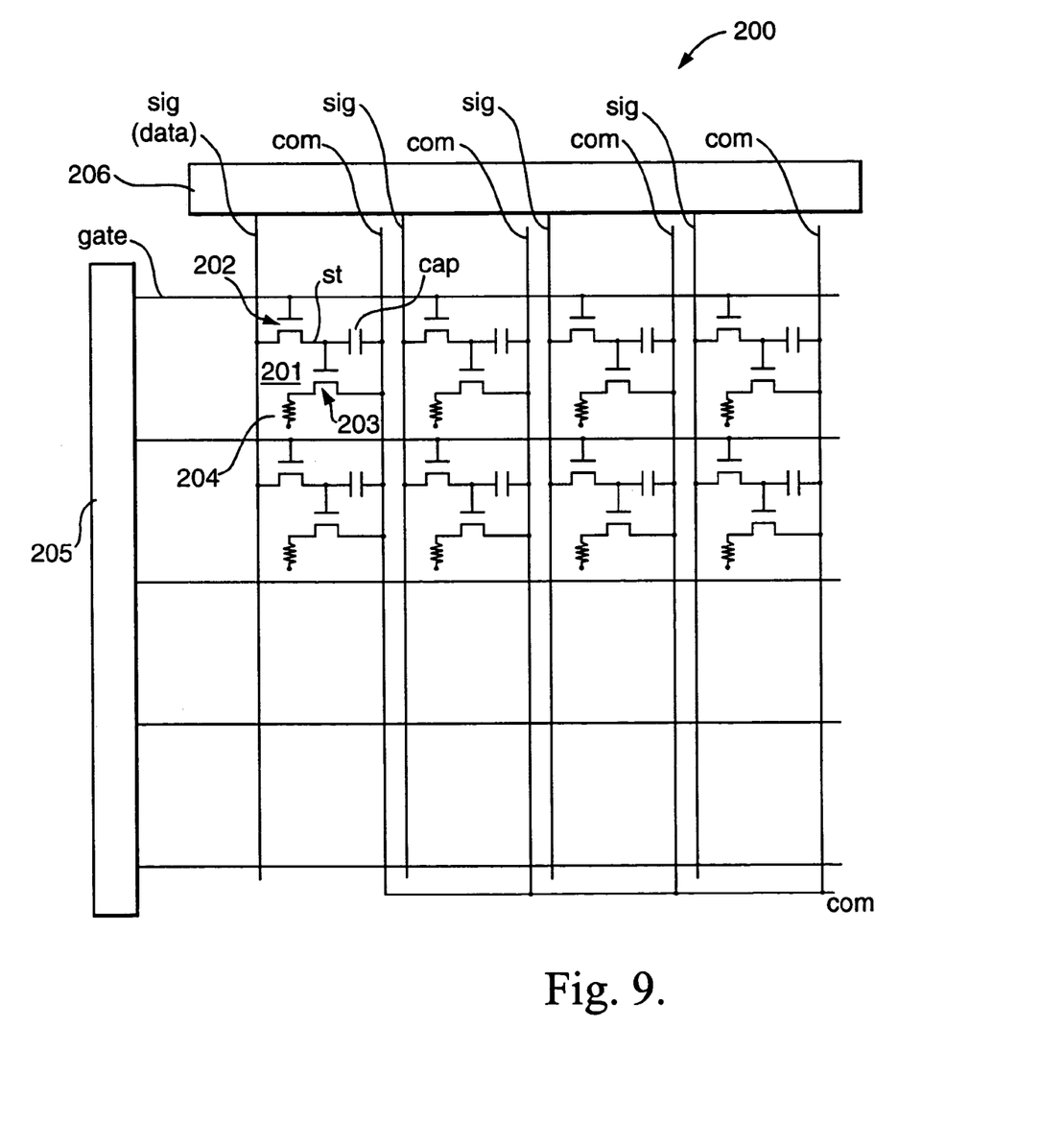
FIG. 9 shows a block diagram of an electrooptic device.

FIG. 9 is a block diagram illustrating an active matrix type display device (or apparatus) incorporating electro-optical elements, such as organic electroluminescent elements as a preferred example of the electro-optical devices, and an addressing scheme which may be fabricated in accordance with the patterning method of the present invention. In the display device 200 shown in this figure, a plurality of scanning lines "gate", a plurality of data lines "sig" extending in a direction that intersects the direction in which the scanning lines "gate" extend, a plurality of common power supply lines "com" extending substantially parallel to the data lines "sig", and a plurality of pixels 201 located at the intersections of the data lines "sig" and the scanning lines "gate" which are formed above a substrate.

Each pixel 201 comprises a first TFT 202, to which a scanning signal is supplied to the gate electrode through the scanning gate, a holding capacitor "cap" which holds an image signal supplied from the data line "sig" via the first TFT 202, a second TFT 203 in which the image signal held by the holding capacitor "cap" is supplied to the gate electrode (a second gate electrode), and an electro-optical element 204 such as an electroluminescent element (indicated as a resistance) into which the driving current flows from the common power supply line "com" when the element 204 is electrically connected to the common power supply line "com" through the second TFT 203. The scanning lines "gate" are connected to a first driver circuit 205 and the data lines "sig" are connected to a second driver circuit 206. At least one of the first circuit 205 and the second circuit 205 can be preferably formed above the substrate above which the first TFTs 202 and the second TFTs 203 are formed. The TFT array(s) manufactured by the methods according to the present invention can be preferably applied to at least one of an array of the first TFTs 202 and the second TFTs 203, the first driver circuit 205, and the second driver circuit 206.

The present invention may therefore be used to fabricate displays and other devices which are to be incorporated in many types of equipment such as mobile displays e.g. mobile phones, laptop personal computers, DVD players, cameras, field equipment; portable displays such as desktop computers, CCTV or photo albums; instrument panels such as vehicle or aircraft instrument panels; or industrial displays such as control room equipment displays. In other words, an electro-optical device or display to which the TFT array(s) manufactured by the methods according to the present invention is (are) applied as noted above can be incorporated in the many types of equipment, as exemplified above.

Various electronic apparatuses using electro-optical display devices fabricated in accordance with the present invention will now be described.

<1: Mobile Computer>

An example in which the display device fabricated in accordance with one of the above embodiments is applied to a mobile personal computer will now be described.

Figures 10, 11, 12:
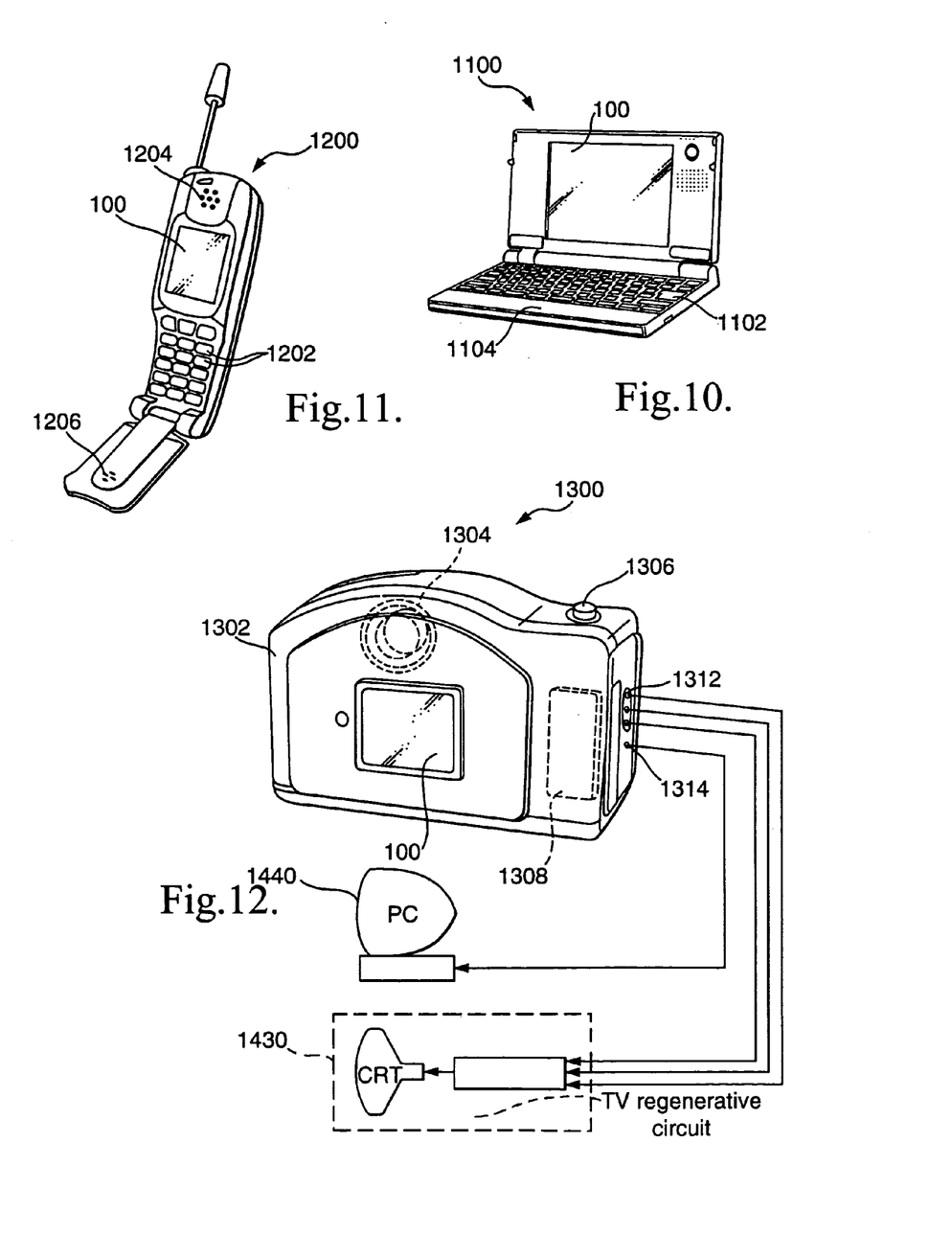
FIG. 10 is a schematic view of a mobile personal computer incorporating a display device fabricated in accordance with the present invention.
FIG. 11 is a schematic view of a mobile telephone incorporating a display device fabricated in accordance with the present invention.
FIG. 12 is a schematic view of a digital camera incorporating a display device fabricated in accordance with the present invention.

FIG. 10 is an isometric view illustrating the configuration of this personal computer. In the drawing, the personal computer 1100 is provided with a body 1104 including a keyboard 1102 and a display unit 100. The display unit 100 is implemented using a display panel fabricated according to the patterning method of the present invention, as described above.

<2: Portable Phone>

Next, an example in which the display device is applied to a display section of a portable phone will be described. FIG. 11 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display device fabricated in accordance with the method of the present invention, as described above.

<3: Digital Still Camera>

Next, a digital still camera using an OEL display device as a finder will be described. FIG. 12 is an isometric view illustrating the configuration of the digital still camera and the connection to external devices in brief.

Typical cameras use sensitized films having light sensitive coatings and record optical images of objects by causing a chemical change in the light sensitive coatings, whereas the digital still camera 1300 generates imaging signals from the optical image of an object by photoelectric conversion using, for example, a charge coupled device (CCD). The digital still camera 1300 is provided with an OEL element 100 at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 100 and releases the shutter 1306, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 10, the portable phone shown in FIG. 11, and the digital still camera shown in FIG. 12, include OEL element television sets, view-finder-type and monitoring-type video tape recorders, vehicle navigation and instrumentation systems, pagers, electronic notebooks, portable calculators, word processors, workstations, TV telephones, point-of-sales system (POS) terminals, and devices provided with touch panels. Of course, OEL devices fabricated using the method of the present invention can be applied not only to display sections of these electronic apparatuses but also to any other form of apparatus which incorporates a display section.

Furthermore, the display devices fabricated in accordance with the present invention are also suitable for a screen-type large area television which is very thin, flexible and light in weight. It is possible therefore to paste or hang such large area television on a wall. The flexible television can, if required, be conveniently rolled up when it is not used.

Printed circuit boards may also be provided with the technique of the present invention. Conventional printed circuit boards are fabricated by photolithographic and etching techniques, which increase the manufacturing cost, even though they are a more cost-oriented device than other microelectronics devices, such as IC chips or passive devices. High-resolution patterning is also required to achieve high-density packaging. High-resolution interconnections on a board can be easily achieved by depositing colloidal metal suspension onto protruding regions of the boards, separated by indents. The suspension of highly conductive metals such as copper, gold, silver or aluminium is suitable for this purpose. The indented prepatterning is fabricated by stamping, moulding or replica techniques at a very low cost. The conductive paths are formed on the protruding regions, so electric contact between interconnections and electronic parts are easily obtained. By repeating printing and moulding processes, multi-layered circuit boards can be provided.

Colour filters for colour display applications may also be provided with the present invention. The array of the protruding regions separated with indent gaps is fabricated by stamping, moulding or replica techniques on a transparent substrate consisting of glass or plastics. Droplets of liquid containing dye or pigment are then deposited onto some or all of the protruding regions, and after drying, the dye or pigments in the droplets act as filter layers on the protruding region.

Polymer light emitting diode displays may also be fabricated by a similar technique to the colour filters described above. Instead of a liquid containing dye or pigment, a solution of light emitting polymer or molecular material is deposited onto protruding electrodes.

DNA array chips may also be provided with the present invention. Solutions containing different DNAs are deposited onto the array of the protruding regions separated with indent gaps, which are fabricated by stamping, moulding or replica techniques.

Micro-channels for integrated chemical chips may also be fabricated with the present invention. Liquid for a chemical reaction is caused to flow onto the protruding channel regions separated with indent gaps, and led to a reactor. These can also be provided with the technique of the present invention.

The foregoing description has been given by way of example only and it will be appreciated by a person skilled in the art that modifications can be made without departing from the scope of the present invention. For example, a person skilled in the art will appreciate that a wide variety and various combinations of substrates, and materials to be patterned can be selected. In addition, it will be appreciated that a variety of shapes, sizes and patterns can be used.

The invention claimed is:

1. A patterning method, comprising:
   depositing a first liquid material on a substrate surface adjacent to a first side of a plurality of indents formed in the substrate surface; and
   depositing a second liquid material on the substrate surface adjacent to a second side of the plurality of indents,
   the first and second sides of the plurality of indents having edges that repel spreading of the first and second liquid materials into the plurality of indents.

2. The patterning method according to claim 1, the first liquid material being the same as the second liquid material.

3. The patterning method according to claim 1, the first liquid material being different from the second liquid material.

4. A method of manufacturing an electronic device, the method comprising:
   making a pattern by the patterning method according to claim 1.

5. The method of manufacturing an electronic device according to claim 4 wherein the first liquid material includes a semiconductor material, and the second liquid material includes a semiconductor material.

6. The method of manufacturing an electronic device according to claim 5 wherein a source of a transistor is formed between the at least one of a plurality of indents and a second indent of the plurality of indents, and a drain of the transistor is formed between the at least one of a plurality of indents and a third indent of the plurality of indents, and a channel of the transistor being formed between the first part and the second part.

7. A patterning method according to claim 1, each of the plurality of indents having wall portions which have slopes relative to the surface of the substrate.

8. The patterning method according to claim 1, the plurality of indents being formed with a cross-sectional profile including a secondary barrier to control spreading of the first liquid material and the second liquid material.

9. The patterning method according to claim 8 wherein the secondary barrier is provided with a castellated cross-sectional profile.

10. The patterning method according to claim 8 wherein the secondary barrier is provided with a saw-tooth cross-sectional profile.

11. The patterning method according to claim 8 wherein the plurality of indents include first and second indent regions of elongate shape and a further elongate indent region is arranged between but spaced from the first and second indent regions, the further elongate indent region having a substantially planar bottom surface.

12. The patterning method according to claim 1, further comprising:
   adjusting wetting characteristic of the surface of the substrate relative to the first liquid material and the second liquid material.

13. The patterning method according to claim 1, each of the plurality of indents having a substantially planar bottom surface.

14. The patterning method according to claim 1, further comprising forming the plurality of indents by an impression technique.

15. The patterning method according to claim 14, the impression technique using at least one of a stamping die and a moulding technique.

16. The patterning method according to claim 1, the first liquid material including a conductive material.

17. A patterning method comprising:
   forming an indent region in the surface of a substrate; and
   depositing a liquid material onto the surface at selected locations adjacent to the indent region such that spread of the liquid material over the surface is repelled by an edge of the indent region,
   wherein the indent region is formed with a cross-sectional profile to provide a secondary barrier within the indent region to further repel the spread of the material; and
   wherein the material is selected to form a semiconductor material and the selected locations are between the indent region and an adjacent indent region so as to provide source and drain regions for a thin film transistor having a channel length determined by a width of the indent region and a channel width determined by a length of the indent region.

18. A patterning method for depositing a liquid onto a surface of a substrate, said method comprising:
   forming a first and second indent in the surface of the substrate, each indent having falling edges co-incident with the surface and spaced a distance apart, the first and second indents including wall portions sloping relative to the surface, the falling edges repel spreading of the liquid into the indents;
   depositing said liquid between and adjacent to said indents; and
   selecting the distance between the falling edges such that a greater volume of liquid is deposited and retained than in the absence of at least one of the indents.

19. A method of manufacturing an electronic device, the method further comprising:
   making a pattern by the patterning method according to claim 18.

20. A patterning method for depositing a liquid onto a surface of a substrate, said method comprising:
   forming a first and second indent in the surface of the substrate, each indent having falling edges co-incident with the surface and spaced a distance apart, the first and second indents including wall portions sloping relative to the surface, the falling edges repel spreading of the liquid into the indents;

depositing said liquid between and adjacent to said indents; and selecting the distance between the falling edges such that a greater contact angle between the liquid and the surface is provided than in the absence of at least one of the indents.

21. A method of manufacturing an electronic device, the method comprising: making a pattern by the patterning method according to claim 20.

22. A patterning method for depositing a liquid onto a surface of a substrate, said method comprising:

forming a first and second indent in the surface of the substrate, each indent having falling edges co-incident with the surface and spaced a distance apart, the first and second indents including wall portions sloping relative to the surface, the falling edges repel spreading of the liquid into the indents;

depositing said liquid between and adjacent to said indents; and selecting the distance between the falling edges such that a diameter of the deposited liquid is greater than the distance between the falling edges.

23. A method of manufacturing an electronic device, the method comprising: making a pattern by the patterning method according to claim 22.

24. A patterning method for depositing a liquid onto a surface of a substrate, said method comprising:

forming a first and second indent in the surface of the substrate, each indent having falling edges co-incident with the surface and spaced a distance apart, the first and second indents including wall portions sloping relative to the surface, the falling edges repel spreading of the liquid into the indents;

depositing said liquid between and adjacent to said indents; and selecting the distance between the falling edges such that a thickness of the liquid deposited and retained on the surface of the substrate is greater than in the absence of at least one of the indents.

25. A method of manufacturing an electronic device, the method comprising: making a pattern by the patterning method according to claim 24.

26. A patterning method, comprising:

depositing a first liquid material on a substrate surface adjacent to a first side of an indent formed in the substrate surface; and depositing a second liquid material on the substrate surface adjacent to a second side of the indent, each of the first and second sides of the indent having an edge that repels spreading of the first and second liquid materials into the indent, the indent having a width tapering towards a bottom.

27. A patterning method, comprising:

depositing a first liquid material on a substrate surface adjacent to a first side of an indent formed in the substrate surface; and depositing a second liquid material on the substrate surface adjacent to a second side of the indent, each of the first and second sides of the indent having an edge that repels spreading of the first and second liquid materials into the indent, the indent having a width widening towards a bottom.

* * * * *